United States Patent [19]
Momtaz

[11] Patent Number: 5,945,855
[45] Date of Patent: Aug. 31, 1999

[54] HIGH SPEED PHASE LOCK LOOP HAVING HIGH PRECISION CHARGE PUMP WITH ERROR CANCELLATION

[75] Inventor: Afshin D. Momtaz, Irvine, Calif.

[73] Assignee: Adaptec, Inc., Milpitas, Calif.

[21] Appl. No.: 08/920,524

[22] Filed: Aug. 29, 1997

[51] Int. Cl.⁶ .................................................. H03L 7/06
[52] U.S. Cl. ...................... 327/157; 327/156; 327/536; 327/537; 375/374; 375/373
[58] Field of Search ................... 327/157, 536, 327/537, 156; 375/374, 373

[56] References Cited

U.S. PATENT DOCUMENTS

| | | | |
|---|---|---|---|
| 4,714,900 | 12/1987 | Sata | 331/8 |
| 4,959,618 | 9/1990 | Shier | 327/157 |
| 5,508,660 | 4/1996 | Gersbach | 331/17 |
| 5,532,636 | 7/1996 | Mar | 327/543 |
| 5,734,279 | 3/1998 | Bereza | 327/112 |

*Primary Examiner*—Tim Callahan
*Assistant Examiner*—April Giles
*Attorney, Agent, or Firm*—Christie, Parker & Hale, LLP

[57] ABSTRACT

A high precision charge pump used in a phase-lock loop incorporating a type-IV phase/frequency detector is designed and constructed to substantially eliminate the effects of ringing and glitch errors on the charge pump output current as averaged over a pump-up and pump-down cycle by the type-IV phase/frequency detector. The high precision charge pump is constructed exclusively of transistors of a single polarity (N-channels) that are so matched as to each have the same current characteristics. The current pulse length, absolute magnitude, and waveform envelopes of the charge pumps source and sink currents are defined by matched transistors. When the type-IV phase/frequency detector is operating in quasi flywheel mode, and no phase comparisons are being made, the charge pump's source current is equal to the sink current in all significant respects such that no incremental, residual charge is left on a loop capacitor following the conclusion of a sequential pump-up and pump-down sequence.

9 Claims, 6 Drawing Sheets

HIGH SPEED PHASE LOCK LOOP HAVING HIGH PRECISION CHARGE PUMP WITH ERROR CANCELLATION

RELATED APPLICATIONS

This application is related to co-pending applications entitled High Speed Phase Lock Loop Having Constant Bandwidth, and GHz Transceiver Phase Lock Loop Having Autofrequency Lock Correction, both filed on instant date herewith and commonly owned by the Assignee of the present invention, the entire disclosures of which are expressly incorporated herein by reference.

FIELD OF THE INVENTION

The present invention is directed to high speed data transmission and conversion systems and, more particularly, to a system for and a method of controlling the average current output of a charge pump such that ringing and glitch errors are canceled so as to give a substantially zero average current when integrated over time.

BACKGROUND OF THE INVENTION

The past few years have seen a dramatic increase in the speed of data transmission between various components of a computer system or between multiple computer systems connected together in a network. Indeed, since general acceptance of personal computer systems in the 1960's, data transmission speeds have grown with an almost power law dependence; about 1 MHz in the '60's, 10 MHz in the '70's, 100 MHz in the '80's, and 1 GHz speeds being routinely achieved in the '90's.

Optical fibre is a particular enabling technology for modern day 1 GHz data transmission speeds and, in the computer industry, has given rise to a data transfer protocol and interface system termed Fibre-Channel. Fibre-Channel technology involves coupling various computer systems together with optical fibre or a fibre channel-type electrically conductive (copper) cable and allows extremely rapid data transmission speeds between machines separated by relatively great distances. However, because of the physical characteristics of fibre channel-type cable, present day systems are only capable of serial-fashion data transmission (at least when only a single optical fibre or electrical cable is used to interconnect various computer systems). However, computer systems are constructed to almost universally handle data in parallel fashion on byte-multiple signal busses (8-bit, 16-bit or 32-bit busses), making it incumbent on any data transmission system to provide some means for converting a 1 GHz serial data stream into a byte or byte-multiple parallel data stream. Conversely, since the fibre channel protocol is 2-way, computer systems that typically operate with parallel data structures, must have some means for serializing a byte or byte-multiple data stream into a 1 GHz data signal suitable for transmission down an optical fibre or electrically conductive (copper) cable.

Parallel data being serialized for high speed transmission, is typically synchronous, in that the sequence of 1's and 0's making up the resulting serial data stream occurs with reference to a uniform or single-frequency serializer clock signal. Encoding and transmitting the clock signal, together with the data, would take up inordinate amounts of valuable signal bandwidth and reduce the overall data transmission speed of a fibre channel system. Even though some small degree of self-clocking is inherent in the serial data stream, some method of evaluating the data stream must be used in order that a transceiver or serial-to-parallel data recovery system may determine how to appropriately frame the binary data stream into bytes.

In many applications, this function is performed by various types of data synchronizers, which generate or regenerate a synchronous timing reference signal from a serial data stream and provides the timing reference to a serial-to-parallel converter, such as a sequential latch. In effect, a data synchronizer generates a synchronous stream of successive timing references, each timing reference representing a bit cell with which a data bit is associated. For example, 10 consecutive timing references might represent an 8-bit data word followed by 2 bits of error correction code which might then be latched out onto a 10-bit parallel data bus by a, for example, 10-bit counter. The data synchronizer, accordingly, is an essential component in modern day gigahertz serial to parallel data converters.

However, the frequency of clock signals synthesized by such circuitry is subject to a number of variations introduced by the electronic components of such systems. Typically, the electronic components in the data path introduce elements of phase and frequency noise which are random in nature and, more particularly, have dramatically varying bandwidth characteristics depending on the geometric and electronic variations in modern semiconductor manufacturing process parameters. A synchronizer, such as a 1.06 GHz to 106 MHz Transceiver, must take these variations into account when attempting to deal with a 1.06 GHz serial data stream. Implementations of such a synchronizer or transceiver, typically include at least phase-locked loop (PLL), normally comprising a phase or phase and frequency detector, a charge pump, an analog filter, and means for generating asynchronous clock signal, such as a voltage control oscillator (VCO). When receiving data, during what is conventionally termed frequency or velocity lock, the oscillation frequency of the VCO is determined by, and locked to the frequency of an external clock provided for such purpose, just prior to receiving the serial data stream. Once frequency or velocity lock is established, the VCO runs in what might be termed a quasi-flywheel mode at a mean frequency determined during velocity lock. Subsequent correction control to the VCO frequency is developed by phase-locking a transition edge of the synchronous VCO signal to a transition edge of an incoming data signal. The VCO is phase-locked to the incoming serial data stream by comparing the phase of the rising edge of the VCO clock signal to the phase of the rising edge of a data One (1) bit, in a phase detector. A phase or time difference detected between the two rising edges causes the phase detector to issue a signal to the charge pump which, in turn, generates a control voltage through an analog filter, directing the VCO to either speed up or slow down in response to frequency variation in the data stream.

An analog low pass filter is typically provided between the charge pump and the VCO to reject corrections resulting from random high-frequency variations of individual data bits, and allow ideally only corrections resulting from consistent frequency shifts of the data stream. The VCO is therefore locked to the mean phase of the data stream, rather than to the phase of a particular data bit. Once phase-locked, the synchronous VCO signal provides for a recovered clock signal whose rate (frequency) is equal to the data bit rate or an integral multiple thereof.

A typical prior art phase-lock loop system is illustrated in FIG. 1, and is connected to receive an incoming serial data stream from, for example, an optical fibre cable 10. The phase-lock loop suitably comprises a type-IV phase detector 11 (also referred to as a Charlie Hogge-type phase detector), coupled to a charge pump 12, operatively connected in turn to an analog filter 13 and a voltage controlled oscillator or VCO 14.

Serial data is received over the, for example, optical cable 10 at a data input of the phase detector 11, in which the occurrence of its rising edge (its phase) is compared in time to the occurrence of the rising edge (the phase) of an output signal of the VCO 14. Conventionally, the phase detector incorporates logic circuitry (in effect a logical NOR function) which precludes an output signal from being issued during phase comparisons unless two rising edges are present during a comparison cycle. This feature prevents the phase-lock loop from becoming unstable by trying to perform a phase comparison between a VCO rising edge and a data ZERO bit (necessarily without a rising edge). It will be understood that the phase comparison result in such a situation would indicate either an infinite phase lead or an infinite phase lag, thus causing the VCO frequency to significantly shift.

Certain prior art systems have attempted to overcome this potential instability by delaying the data stream in time by a delay line and directing the resulting delayed data to the data input of the phase detector 11. Data signals, prior to being directed through the delay line, are also applied to an enable input of the phase comparator as well as to the input of the delay line. The enable input of the phase detector is configured such that it receives a data ONE pulse just prior to the same data ONE pulse appearing at the data input of the phase detector. The phase detector is further configured so that phase comparisons are precluded, or phase comparisons do not result in an output signal, unless the phase comparator has been enabled by a data ONE bit. In operation, if the data stream comprises a series of data ZEROS, no enable signal will be directed to the phase detector and no phase comparisons will be performed. At each occurrence of a data ONE bit, the raw data ONE signal will enable the phase detector just prior to the delayed data ONE signal reaching the data input. A phase comparison between the leading edge of the data ONE signal and the leading edge of the VCO signal is now allowed to take place.

While this method is relatively successful for PLL's operating at relatively low frequencies (approximately 10 MHz), it will be understood that such a system does not realize adequate performance for data rates in the 1 GHz range.

In contrast to the PLL systems described above, a Charlie Hogge-type (or type-IV) phase detector is in continuous operation, and issues continuous pump-up and pump-down commands to a charge pump regardless of the logical state of an incoming data bit. It might be said that a Charlie Hogge-type phase detector operates in a "quasi flywheel" mode when the incoming data stream comprises a sequence of data ZEROS and modulates the pump-up or pump-down signal in response to a phase comparison only for the occurrence of a logical ONE at the data input.

The output of the phase detector 11 comprises a pump-up (or UP) 16 and a pump-down (or DN) 18 signal which, in turn, direct the charge pump 12 to either source or sink current to or from the analog filter 13 which develops a voltage control signal for adjusting the speed of the VCO 14.

According to convention, the phase detector 11 issues UP 16 if the data stream leads the VCO signal, and issues DN 18 if the serial data stream phase lags the signal stream from the VCO 14. UP 16 and DN 18 are directed to the charge pump 12 which sources or sinks a particular amount of current (noted herein $I_{CP}$) to or from, respectively, a capacitor comprising the filter 13. A voltage is developed as the charge pump current $I_{CP}$ is sourced or sunk to or from the capacitor. Thus voltage is used to control the VCO. The sign of the VCO control voltage variation depends on whether the phase of the data stream leads or lags the phase of the VCO output, and its magnitude is a function of the extent of the phase lead or phase lag. Thus, the operating frequency of the VCO 14 is increased or decreased, as appropriate, to reduce the phase lead or phase lag of the inputs to the phase detector 11. The phase-locked loop thus ensures that the VCO output, which may be used as a timing reference, is locked in phase with the incoming serial data stream.

A particular shortcoming of prior art phase lock loop systems is that the charge pump is required to source and sink current which precisely represents the magnitude and polarity of a phase difference between an incoming data ONE signal and the VCO. In addition, for a type-IV phase detector operating in a quasi flywheel mode during the occurrence of data ZEROS, the charge pump is required to source and sink current in such a manner that the output current, averaged over a correction cycle, equals zero. In other words, the charge pump should ideally only cause corrections to be made to the operating characteristics of the VCO which result from consistent frequency shifts of the data stream, such that the VCO is locked to the mean phase of the incoming data stream rather than to the phase of any particular data bit.

Maintaining perfect phase-lock of VCO to data, however, is particularly difficult for conventional prior art-type phase-lock loop circuits operating in the GHz range, because of the internal construction of conventional prior art-type charge pump circuits. In addition, the source and sink current waveforms, of such conventional charge pump circuits, exhibit significant amounts of ringing and "glitch errors" which cause the source and sink current waveforms to be non-symmetrical. This non-symmetry necessarily results in a residual charge being left on the filter capacitor at the end of a correction cycle and further causes a non-zero increment to the control voltage $V_C$ to the VCO.

The terms "ringing" and "glitch errors" refer to fluctuations in the source and/or sink current waveforms and represent quantifiable departures from a smooth waveform characteristic. As will be described in greater detail below, these fluctuations are caused by a variety of factors, the majority of which are functions of the physical and electrical properties of semiconductor integrated circuit transistors and integrated circuit charge pumps manufactured therefrom.

To better understand the effects of "ringing" and "glitch errors" on the stability of a phase-lock loop, it will be helpful to review the operation of a PLL, such as illustrated in FIG. 1, having recourse to the waveform diagrams of FIGS. 2a–2g. In the waveform diagrams of FIGS. 2a–2g, 2a represents a VCO signal train as would be developed by a VCO 14 and provided to the VCO input of a type-IV phase detector 11. FIG. 2b represents the occurrence of a data ONE followed by a sequence of data zeros as would be provided at the data input of the phase detector 11. It should be noted that the periodicity of the VCO signal train defines a sequence of intervals, with each interval representing a phase correction cycle. For purposes of illustration only, the correction intervals are depicted between sequential VCO signal rising edges. FIGS. 2c and 2d illustrate a pump-up and pump-down pulse, respectively, provided by the phase detector during correction cycles in which no data ONE bit appears, in accordance with the conventionally understood operation of a type-IV phase detector. When a PLL is operating in quasi flywheel mode, the phase detector conventionally issues a pump-up signal having a characteristic pulse width, T, immediately followed by a pump-down signal having the same pulse width, T. Although only a single pump-up and pump-down signal is depicted in FIGS. 2c and 2d, it will be understood that type-IV phase detectors often operate by issuing continuous pump-up and pump-down signals and that such signals are not necessarily 180 degrees out of phase with one another. Indeed, pump-up and pump-down may be issued simultaneously, 90 degrees out of phase, or with any other consistent phase relationship defined by the circuit designer.

The pump-up and pump-down pulses depicted in FIGS. 2c and 2d give rise to positive and negative charge pump currents ($+I_{CP}$ and $-I_{CP}$) as depicted in FIGS. 2e and 2f. A positive $I_{CP}$ represents current sourced to a capacitor in the filter section 13 of the PLL in response to a pump-up signal issued by the phase detector 11, while a negative $I_{CP}$ represents current sunk from the filter capacitor in response to a pump-down signal from the detector 11. Each of the currents, $+I_{CP}$ and $-I_{CP}$ have a specific magnitude ($I_{CP}$) and a characteristic pulse length which is, ideally, equal to the pulse length of the pump-up and pump-down pulses, T.

As depicted in FIG. 2g, a positive charge pump current ($+I_{CP}$) causes a charge to accumulate on the filter capacitor which results in a linear voltage characteristic (in the positive direction) being applied to the $V_C$ output of the filter 13. As the charge pump current changes from positive to negative, the negative current ($-I_{CP}$) removes charge from the filter capacitor, causing the $V_C$ voltage to decline in a linear fashion to its originally held value. In order not to perturb the PLL system, the output voltage of the filter section 13 ($V_C$) must return to its nominal value if the PLL is operating "quasi flywheel". It is only when a phase comparison is taking place and there is some phase lead or phase lag detected by the phase detector 11, that the final $V_C$ value will be different from the initial $V_C$ value.

In order for $V_C$ to retain its nominal value following a quasi flywheel correction cycle, it is necessary that the amount of charge introduced to the filter capacitor exactly equal to the amount of charge removed from the filter capacitor during the cycle. For this condition to hold, it is therefore necessary for the amount of current ($+I_{CP}$) sourced to the capacitor to be identically equal to the amount of current ($-I_{CP}$) sunk from the capacitor. Accordingly, the current waveforms of FIGS. 2e and 2f must be precisely symmetrical such that the average of the two currents sums to exactly zero.

The effects of "ringing" and "glitch errors" on the symmetry of source and sink current waveforms are illustrated in the waveform diagrams of FIG. 3. As can be seen in FIG. 3, as the charge pump sources current in response to a pump-up signal, the characteristic rise time of the $+I_{CP}$ waveform is neither smooth, uniform nor sharply vertical. Rather, the current response characteristic exhibits a slope in the attack portion that is a function, in turn, of the transistor turn-on characteristics of the charge pump output section.

As the current waveform reaches its nominal ($I_{CP}$) saturation value, the waveform characteristic does not immediately roll-over and flatten out its nominal value, but instead "rings" or oscillates in a nonuniform fashion about the nominal current output value. This ringing implies that the absolute value of the current being sourced by the charge pump exceeds, at times, its nominal value while at other times fall significantly below its nominal value before settling. Moreover, as the charge pump transitions from sourcing current to sinking current, the turnoff characteristics of the output transistors cause the output current characteristic to exhibit a decay response rather than a sharply vertical instantaneous shut-off. This decay response also exhibits oscillation or ringing in at the end of conduction, with the output current at times exceeding zero and at other times going negative before settling.

In like fashion, as current is being sunk by the charge pump, the current characteristic exhibits a sloped turn-on, substantial ringing or oscillation, a characteristic delay shape at turn-off ending in substantial ringing as the charge pump output goes to zero.

As can also be seen from FIG. 3, the turn-on and turn-off portions (attack and decay) of the source and sink waveforms are not symmetrical. In addition, notwithstanding the non-uniform frequency and non-uniform decay characteristics of the glitch oscillations, the shape and excursion magnitudes (i.e., the glitch envelope) are different for sourced current as opposed to sunk current. As will be described further, the inherent internal construction of prior art charge pumps precludes sourced current pulses from exactly symmetrically mirroring sink current pulses, such that the amount of charge deposited on a filter capacitor is not equal to the amount of charge removed from the filter capacitor. The control voltage $V_C$ will necessarily be perturbed and take on a final value which is incrementally larger or smaller than its initial value (larger in the illustration of FIG. 3), depending on whether the residual charge on the filter capacitor is positive or negative. This lack of symmetry has significant implications for high speed low-error-rate phase-locked loop systems.

In practical terms, lack of perfect symmetry between sourced and sunk current selectively adds a small component (a glitch error component) to the Control Voltage $V_C$ provided to the VCO. This glitch error component selectively shifts the frequency of the VCO relative to the nominal center frequency of the VCO desired to be maintained during quasi fly-wheel operation. Any offset from the center frequency will cause the phase detector's data capture window to shift and allow a portion of a data pulse position distribution to fall outside the detection window, increasing the error rate.

As mentioned above, the lack of symmetry between a charge pump's sourced current and sunk current is inherent in the transistor elements used to construct prior art charge pumps, as illustrated in FIG. 4.

FIG. 4 illustrates, in simplified semi-schematic block diagrammatic form, a typical prior art-type 3-state charge pump, connected to receive pump-up and pump-down signals from a phase detector 19. The charge pump is implemented as two switched current sources 20 and 22 driving a capacitor 24, which, in turn, defines an output voltage ($V_{OUT}$ OR $V_C$). The charge pump switches comprise an upper and lower switch bank, the upper switch bank comprising a pair of P-channel transistors 26 and 28 coupled at their source terminals to the upper current source 20 and whose drains are connected to the drains of a corresponding pair of N-channel transistors 30 and 32 which comprise the lower switch stack. The lower switch stack transistors have their source terminals connected in common and to the second current source 22. For purposes of explanation, it will be assumed that the upper current source 20 is implemented with PFETs and the lower current source 22 is implemented with NFETs according to well understood convention.

In operation, a pump-up pulse of width T would cause a positive output current $+I_{CP}$ to deposit a charge equal to $(I_{CP}T)$ on the capacitor 24. Likewise, a pump-down pulse of width T would cause a negative current $-I_{CP}$ to remove a charge equal to $(I_{CP}T)$ from the capacitor 24. Thus, in the case of a phase difference, either a positive charge would steadily accumulate on the capacitor, yielding an infinite DC gain for the phase detector, or charge would be steadily removed from the capacitor on every phase comparison, driving DC gain toward negative infinity. In the third state, i.e., lock, the steady state gain is assumed to be zero.

An important implication to this type of charge pump design is that offsets and mismatches between the pump-up and pump-down switch transistors would result in currents being either sourced to or sunk from the capacitor even though the phase detector experiences zero static phase difference at the inputs. Mismatch error is introduced into the behavior of prior art-type charge pumps by implementing the current source switches from different transistor types, i.e., N-channel and P-channel transistors. When these switches turn-off, charge injection and feed-through mismatch, inherent in the different physical properties of P-channel and N-channel transistors, results in an error step at the output which may change the VCO frequency until the next phase comparison cycle. Moreover, when the switches are turned-off, the upper and lower pump currents, $I_{CP}$, generated by the respective current sources 20 and 22, pull their respective source nodes to VDD and ground causing charge-sharing between the capacitor 24 and the internal parasitic capacitances of the various transistors, when the switches are again turned-on. Since the internal parasitic capacitances of N-channel and P-channel transistors are significantly different, the output is significantly disturbed at turn-on. In addition to disturbing the output at turn-on, the well understood parametric differences between N-channel and P-channel transistors necessarily results in the quantifyable glitches introduced at the output for pump-up and pump-down to be different and, hence, the average output current to be non-zero.

Accordingly, prior art-type charge pump circuits do not provide an exact and constant symmetrical relationship between source and sink currents during phase lock, thus introducing variation in the VCO output. This variability becomes proportionately more significant as the VCO frequency increases. Accordingly, for high-speed phase-locked loops, operating in the 1 GHz range, there is a demonstrated need for a high precision charge pump which is designed and constructed such that glitch errors and oscillations are symmetrical for both the source and sink phases of a type-IV phase detection cycle, such that the average current, integrated across a cycle, more closely approximates zero.

SUMMARY OF THE INVENTION

There is provided in accordance with one aspect of the present invention, a high precision charge pump which sources and sinks a characteristic charge pump current for use in connection with a type-IV phase detector in which pump-up and pump-down signals are provided to the charge pump on a continuous basis irrespective the occurrence of a phase comparison. The high precision charge pump is adapted to provide source and sink currents with symmetrical waveform characteristics such that ringing and glitch errors are canceled so as to give a substantially zero average current when integrated over time.

In one aspect of the invention, the charge pump may be viewed as comprising a first current conducting branch in which a characteristic current is conducted in operational response to the pump-up signal and its compliment. The charge pump may also be viewed as comprising a second current conducting branch for conducting the same characteristic current in operational response to the pump-down signal and its compliment. An output node is commonly connected to the first and second conducting branches and the characteristic current is sourced from the output node in response to the pump-up signal and sunk by the output node in response to the pump-down signal.

The first and second conducting branches are constructed of transistors which comprise a common geometry and polarity type such that the characteristic current sourced by the output node defines a waveform shape which is symmetrical to the waveform shape defined by the characteristic current sunk by the output node. When integrated over time, the average current sourced and sunk by the charge pump is substantially zero.

In particular, the first and second current conducting branches each comprise a matched pair of transistors which are connected together in parallel fashion at a common source node. Each common source node is further connected to a current source which is configured to conduct a characteristic current equal to the characteristic source and sink current provided by the output node. The drains of two of the transistors are connected together in parallel fashion and further connected to a current source which also is configured to conduct characteristic current equal to the characteristic source and sink current. The drains of the remaining two transistors are also connected together at a common drain node which is coupled to the first common drain node by a voltage follower such that the drains of the transisters comprising the first and second current conducting branches are maintained at substantially the same potential.

Performance matching of the transistors comprising first and second current conducting branches is ensured by imposing symmetry requirements on the signal paths of the pump-up and pump-down signals as well as their compliments. To the extent of the capabilities of a semiconductor manufacturing process, each of the transistors comprising the two current conducting branches will exhibit substantially identical drain-to-source currents. The identical and symmetrical current response of the transistors comprising the two current conducting branches causes the average characteristic current sourced and sunk at the output node to be substantially equal to zero when averaged over a phase detection correction cycle.

DESCRIPTION OF THE DRAWINGS

These and other features, aspects, and advantages of the present invention will be more fully understood when considered with respect to the following detailed description, appended claims, and accompanying drawings, wherein:

DETAILED DESCRIPTION OF THE INVENTION

Figure 1:
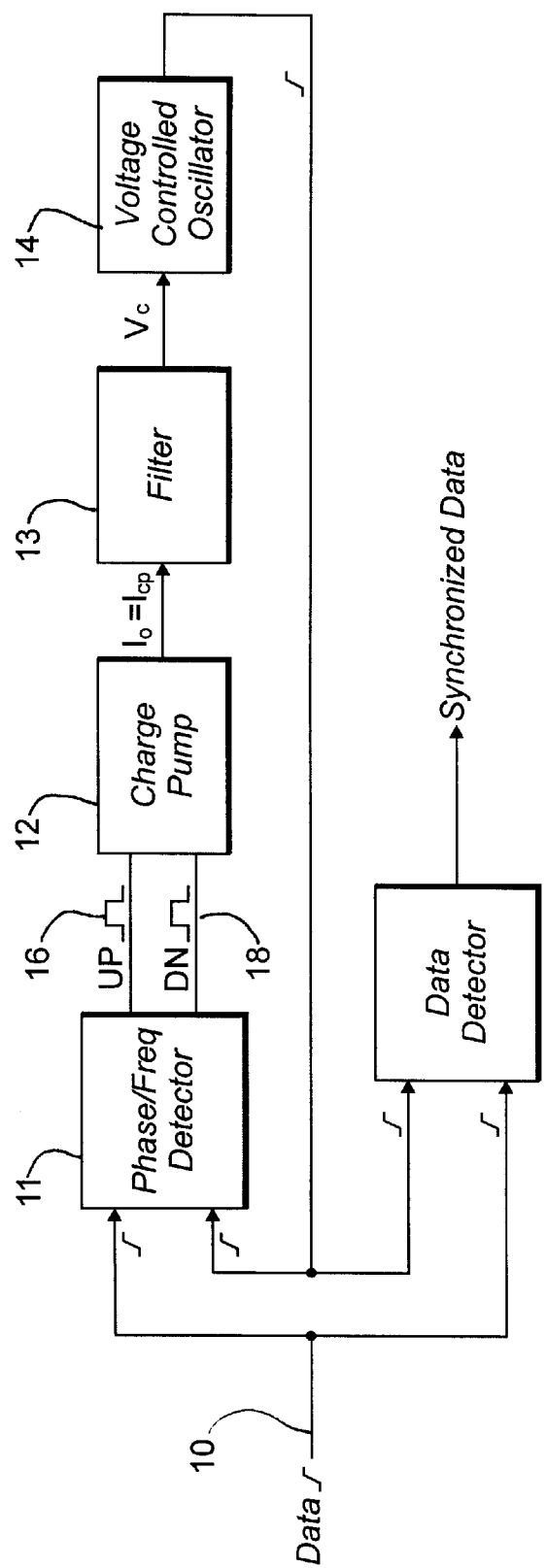
FIG. 1 is a semi-schematic simplified block diagram of a phase lock loop in accordance with the prior art.
Figure 2:
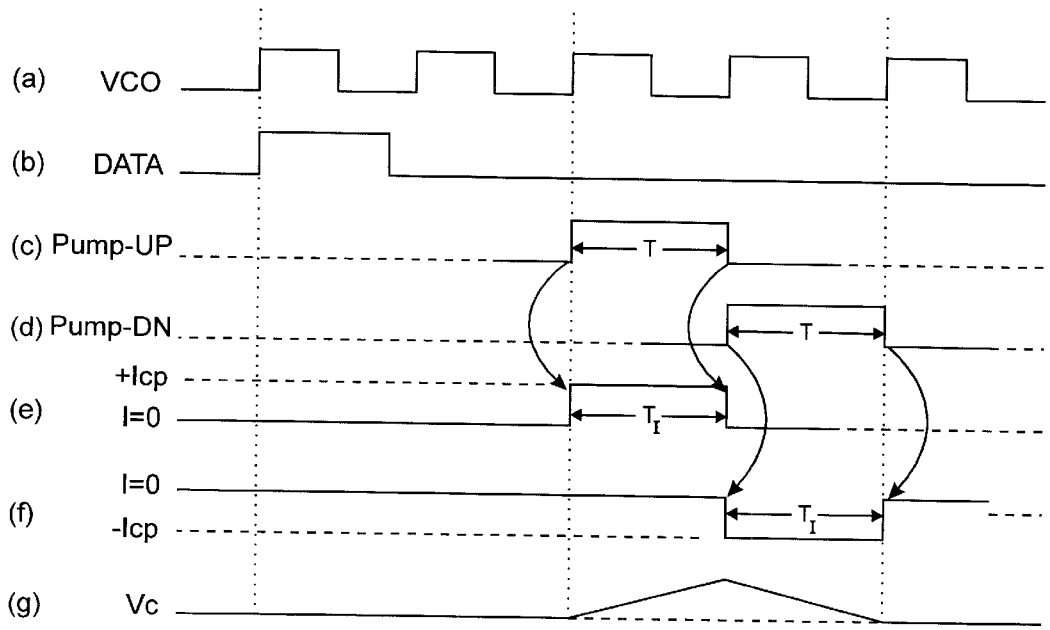
FIGS. 2a–2g are a series of waveform diagrams illustrating the operational characteristics of the phase lock loop of FIG. 1.
Figure 3:
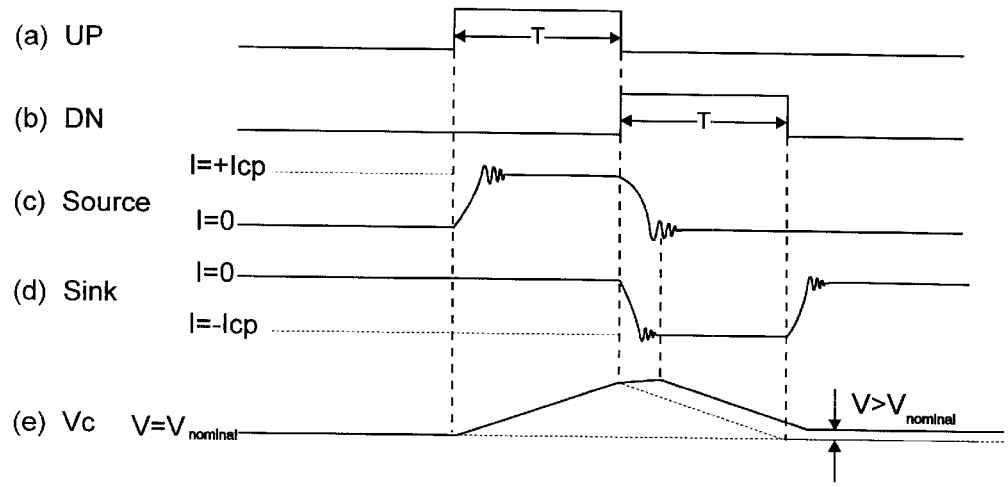
FIG. 3 is a semi-schematic waveform diagram illustrating the non-symmetry of source and sink currents of prior art-type charge pump circuits.
Figure 4:
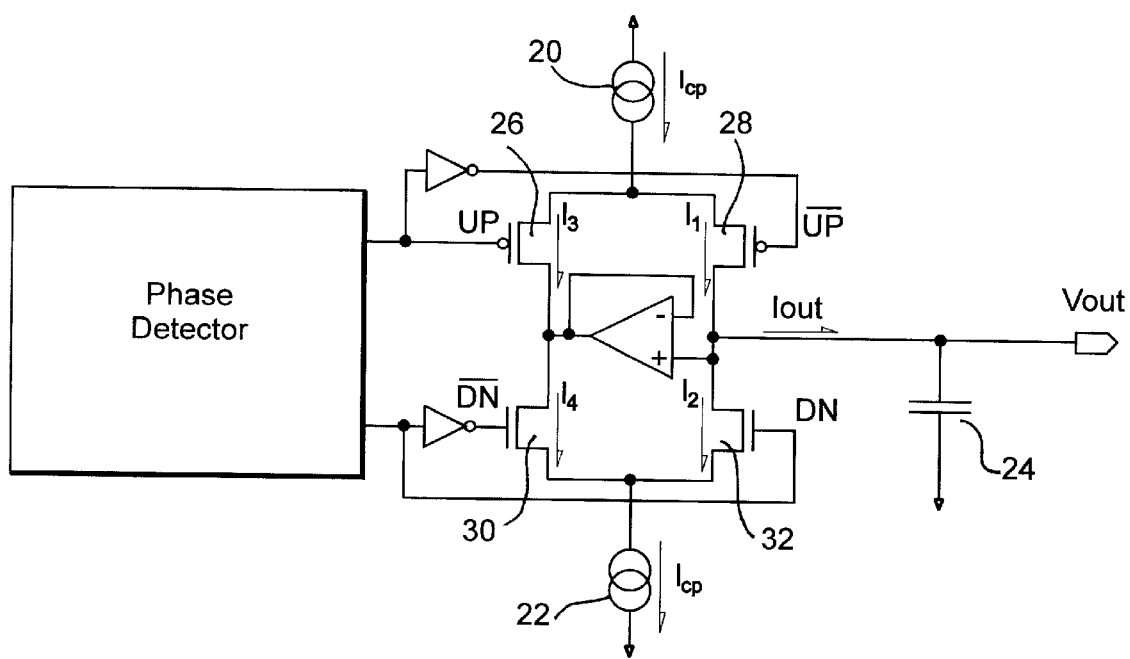
FIG. 4 is a semi-schematic simplified circuit diagram of a charge pump and filter capacitor coupled to a type-IV phase detector in accordance with the prior art.
Figure 5:
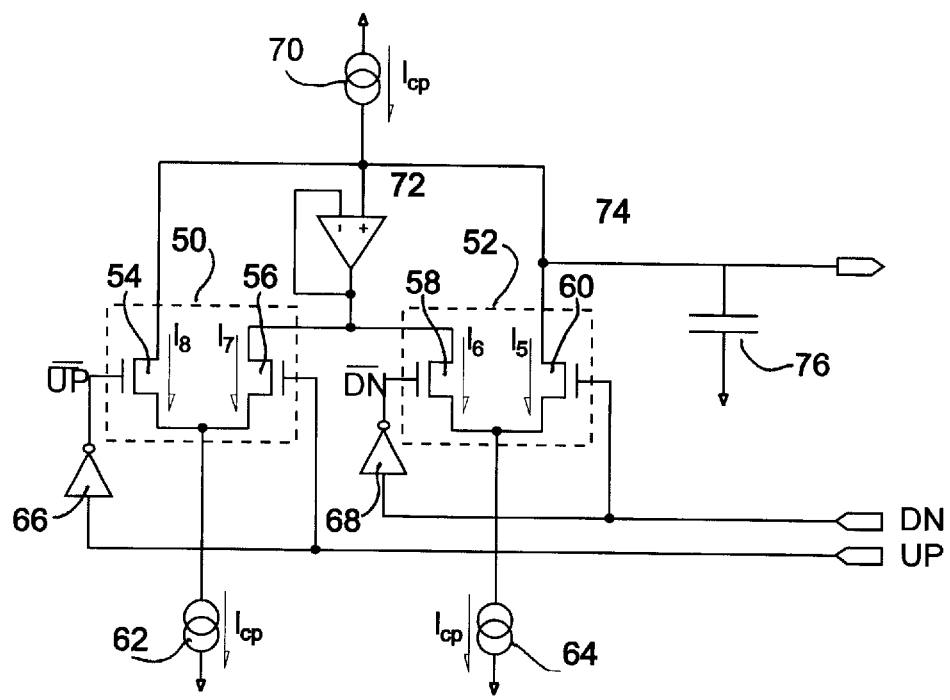
FIG. 5 is a simplified semi-schematic circuit diagram of the switch section of a high precision charge pump with error cancellation constructed in accordance with practice of principles of the invention.

A high precision charge pump configured for use in very high speed applications, such as phase-locked loops operating at VCO frequencies of approximately 1 GHz is depicted in the simplified semi-schematic circuit diagram of FIG. 5. The charge pump, in accordance with the present invention, is seen to be somewhat similar to the conventional charge pump described with reference to FIG. 4, but differs from a prior art charge pump in two significant aspects. First, the switch section of the charge pump is comprised exclusively of N-channel transistors, configured in dual parallel branches. Each of the dual parallel branches comprises a matched pair of identical N-channel transistors, each pair having their source terminals connected in common and further coupled to respective current sources.

The second significant difference between the charge pump according to the invention and prior art-type charge pumps, is that all of the transistors in the switch section are constructed with identical geometries and configured such that the average current sourced from the charge pump can be shown to be identically equal to the average current sunk by the charge pump.

In particular, the charge pump according to the invention comprises first and second parallel switch branches 50 and 52, each constructed of a matched pair of N-channel transistors. The transistors of the first current branch 50 are indicated in FIG. 5 as transistors 54 and 56, while the matched pair comprising the second branch 52 are indicated in FIG. 5 as transistors 58 and 60. As mentioned previously, each of the matched pairs have their source terminals connected in common and further connected to individual current sources; the transistors of the first branch 50 are coupled to a first current source 62 while the transistors of the second branch 52 are coupled to a second current source 64.

The gate terminals of the matched N-channel transistors of each of the parallel switch branches 50 and 52 are configured to be operatively responsive to pump-up (UP) and pump-down (DN) signals received from a type-IV phase detector. The gate terminal of one of the matched N-channel transistors 56, of the first branch 50 is coupled to UP, while the gate terminal of the second matched N-channel transistor 54 is connected to $\overline{UP}$. It will be seen from the exemplary embodiment of FIG. 5, that $\overline{UP}$ is generated by connecting UP through an inverting buffer 66 and thence to the gate terminal of transistor 54.

In like fashion, the matched pair transistors 58 and 60 of the second branch 52 are connected to be operatively responsive to the pump down (DN) signal; with the gate terminal of N-channel transistor 60 connected to DN and the gate terminal of N-channel transistor 58 receiving $\overline{DN}$. $\overline{DN}$ is generated by connecting DN through a second inverting buffer 68 and thence to the gate terminal of transistor 58. In order to promote signal symmetry in the circuit, and thus symmetry in the current response through the N-channel transistors comprising the circuit, inverting buffer 66 and 68 are constructed to comprise identically sized component transistors, each component transistor laid-out in the same orientation in one buffer as in the other, and with all signal path lengths, resistances, and capacitances in one buffer (i.e., inverting buffer 66) precisely the same as in the other buffer (i.e., inverting buffer 68). It will likewise be evident that the signal path length, along with its associated resistance and capacitance values, from the dividing node of UP to the input of inverting buffer 66 will be the same as those from the dividing node of DN to the input of inverting buffer 68. Even though there will be a small phase lag between the assertion of UP and the assertion of $\overline{UP}$, due to the turn on characteristics of inverting buffer 66, the same phase lag magnitude will be present between the assertion of DN and the assertion of $\overline{DN}$, due to the turn on characteristics of inverting buffer 68. What is important, however, is that the path length, and associated parasitics, is the same for $\overline{UP}$ as for $\overline{DN}$, thus ensuring that the waveform, particularly the rise time characteristic, of each of the signals are identical. This symmetry and matching between UP and DN path lengths and $\overline{UP}$ and $\overline{DN}$ path lengths, in combination with the matching of N-channel transistors 54 and 56 and transistors 58 and 60, will play an important part in allowing currents in the various legs of the circuit of FIG. 5 to be equated, as will be described in greater detail below.

The N-channel transistors coupled to DN and $\overline{UP}$ (transistors 54 and 60) have their drain terminals connected in common and to a third current source 70, while the N-channel transistors connected to UP and $\overline{DN}$ (transistors 56 and 58) have their drain terminals connected in common and to the output of an operational transconductance amplifier 72 configured as a voltage follower with its output feed-back connected to its inverting input and its non-inverting input connected to the common drain node of N-channel transistors 54 and 60. In a manner that will be described in greater detail below, the operational transconductance amplifier 72 functions to maintain the $V_{DS}$ voltage at approximately equal levels at the common drain nodes of the matched pair transistors comprising the two branches 50 and 52.

An output node 74 is defined in the common-drain signal path for transistors 54 and 60, and is configured to host currents sourced to and sunk from a capacitor 76 in a manner similar to the prior art charge pump of FIG. 4. Sourcing or sinking current to or from the capacitor 76 causes, in substantial part, production of a voltage change which, as will be described in greater detail below, equates to the control voltage $V_C$ for the Prior to describing the operation of the charge pump of the illustrated embodiment of FIG. 5, it will be helpful to return briefly to the prior art-type charge pump depicted in FIG. 4. As previously described, the prior art charge pump of FIG. 4 inherently introduces glitch errors at the output, such that the average source current is not equal to the average sink current, thus inherently perturbing the performance of the VCO at lock. From an analysis of the charge pump of FIG. 4, it will be understood that the charge pump current ($I_{CP}$) may be expressed as a function of the currents through P-channel transistor 28 and N-channel transistor 32 (identified in FIG. 4 as $I_1$ and $I_l$ respectively). Thus, when the charge pump of FIG. 4 is sourcing current, the average current E[ICP] will be equal to the average current through the P channel, $E[I_1]$. Likewise, when the charge pump is sinking current, the average sink current $E[I_{CP}]$ will be equal to the average current through the N-channel transistor 32, i.e., $E[I_2]$. Thus, over a correction cycle, the average current sourced or sunk to or from the capacitor, may be expressed as:

$$E[I_{CP}]=E[I_2]-E[I_1].$$

There is no basis for equating the currents in the P-channels to the currents in the N-channels. The average output current sourced to or sunk from the capacitor (24 of FIG. 4) can only be expressed as a function of the average currents through an N-channel and a P-channel transistor. Thus, the output current depends on the current characteristics of un-like transistors. From the prior discussion of the non-identical current characteristics between N-channel and P-channel transistors, it will be evident that the average current, $E[I_{CP}]=E[I_1]-E[I_2]$ does not necessarily equal zero. Indeed, the average current through the N-channel may be incrementally larger or smaller than the average current through the P-channel, such that the average output current ($E[I_{CP}]$) retains a residual absolute magnitude and a finite quantity of residual charge is, thus, retained on the loop capacitor (24 of FIG. 4).

This particular analysis of the current characteristics of the prior art-type charge pump of FIG. 4 is significant, because it will be shown below that the current characteristics of the high precision charge pump in accordance with the invention of FIG. 5, are such that the average current sourced to a loop capacitor (76 of FIG. 5) can be shown to be identically equal to the average current sunk from the capacitor. Accordingly, the illustrated embodiment of the high precision charge pump of FIG. 5 can be shown to have an average output current ($E[I_{CP}]$) equal to zero, such that no residual charge is retained on the loop capacitor following a pump-up and pump-down cycle, that might perturb $V_C$. The high precision charge in accordance with the invention therefore operates in a manner to maintain VCO operation at a given frequency and ensure maintenance of VCO lock.

Returning now to FIG. 5, it will be understood that the matched pairs of N-channel transistors 54, 56, 58 and 60 each conduct a current when turned-on by an appropriate logic level signal on their gate terminals. N-channel transistor 60 conducts a first current, identified in FIG. 5 as $I_5$, N-channel transistor 58 conducts a second current identified as $I_6$, N-channel transistor 56 conducts a third current identified as $I_7$ and N-channel transistor 54 conducts a fourth current identified as $I_8$. Clearly, when the current sources 62, 64 and 70 are each configured to force a current $I_{CP}$ through their respective branches of the charge pump, the current $I_{CP}$ of current source 64 will be equal to the current flowing through N-channel transistors 58 and 60, while the current $I_{CP}$ from current source 62 will be equal to the current flowing through N-channel transistors 54 and 56. This relationship necessarily holds for the average of the currents, and may be expressed in mathematical form as:

$$E[I_{CP}]=E[I_5+I_6]$$

as necessarily follows from Kirkoff's law.

The current analysis may be extended beyond an evaluation of the current $I_5$ and $I_6$ through transistors 58 and 60. As was previously mentioned, and as will be described in greater detail below, N-channel transistor 60 is constructed to be matched to N-channel transistor 56. In like fashion, N-channel transistor 58 is constructed to be matched to N-channel transistor 54. In addition, the signal path length for DN, coupled to the gate of N-channel transistor 60, is designed to be precisely the same as the signal path length for UP. Thus, not only are N-channel transistors 60 and 56 matched, but the control signals to which they respond have similar and uniform rise times because of the matched parasitics of the signal path length.

Moreover, not only are N-channel transistors 58 and 54 matched but the signal paths for $\overline{UP}$ and $\overline{DN}$ are likewise matched, such that $\overline{UP}$ and $\overline{DN}$ rise and fall times are uniform and similar. Given this matching among the N-channel transistors comprising the circuit, and the control signal path lengths, the currents through like paths, i.e., $I_5$ and $I_7$, and $I_6$ and $I_8$, will be symmetrical. Because of this circuit symmetry, the average currents therethrough will also be equal, such that:

$$E[I_6]=E[I_8] \text{ and}$$

$$E[I_5]=E[I_7]$$

A similar analysis can be performed by starting with the currents defined in the first parallel branch 50. The current $I_{CP}$ from current source 62 will be seen to be equal to $I_7$ through transistor 56 plus $I_8$ through transistor 54, which is expressed in mathematical form as:

$$E[I_{CP}]=E[I_7+I_8]$$

because of the circuit symmetries described above, it will be evident that an extended analysis of the circuit will result in:

$$E[I_7]=E[I_5] \text{ and}$$

$$E[I_8]=E[I_6]$$

It will be understood from the foregoing, and from the illustrated embodiment of FIG. 5, that the currents induced in the charge pump circuit in accordance with the invention will be the same upon receipt of a pump-up signal (UP) as for a pump-down signal (DN), in contrast to the operation of the prior art charge pump of FIG. 4. Equating the average current $E[I_3]$ to $E[I_4]$ is not possible in the charge pump of FIG. 4, because $I_3$ is the $I_{DS}$ of an N-channel transistor, while $I_4$ is the $I_{DS}$ of a P-channel transistor. In the charge pump of the illustrated embodiment of FIG. 5, these currents are able to be equated because all of the switch transistors, 54, 56, 58 and 60, are implemented with N-channel transistors, each of which are constructed to be matched such that their $I_{DS}$ currents are identical. This is accomplished, in CMOS technology, by constructing each of the transistors 54, 56, 58 and 60 in close proximity to one another on a silicon integrated circuit and configuring the transistor geometries to be identical. In addition, performance matching is further ensured by imposing symmetry requirements on the signal paths, and their associated parasitics, of UP and DN and their compliment pairs $\overline{UP}$ and $\overline{DN}$. Thus, to the extent of the capabilities of the semiconductor manufacturing process, each of the transistors 54, 56, 58 and 60 will exhibit identical $I_{DS}$ currents in accordance with a well known relation:

$$I_{DS}=k'W/L(V_{GS}-V_T)^2$$

In accordance with the present invention, the mobility expression (the k' values) for each of the transistors 54, 56, 58 and 60 is the same by virtue of their all being fabricated as N-channel transistors, and their geometric constants (W/L) are the same by design. Since each of the transistors are N-channel transistors, the threshold voltage ($V_T$) will be the same, at least within the capabilities of the semiconductor manufacturing process. The remaining term, the gate-to-source voltage ($V_{GS}$) will be understood to be dependent upon the UP and DN signals provided by a type-IV phase detector and, thus, uniform.

The identical and symmetrical current response of transistors 56 and 60 and transistors 54 and 58 leads to the conclusion that the average current $E[I_{CP}]$ at the output node 74 is equal to zero when averaged over a correction cycle of the phase detector. This conclusion is best understood with reference to the following mathematical expressions.

As discussed above, the $I_{CP}$ current from current source 64 is equal to the sum of the currents through transistors 58 and 60, i.e., $I_{CP}=I_5+I_6$. In addition, the $I_{CP}$ current from current source 62 is equal to the sum of the currents through transistors 54 and 56, i.e., $I_{CP}=I_7+I_8$. From the foregoing discussion of average currents it has been shown that, $E[I_5]=E[I_7]$ and $E[I_6]=E[I_8]$. Making use of the equality expressions for average currents and rearranging terms, it will be seen that $I_{CP}=E[I_5]+E[I_8]$ and $I_{CP}=E[I_7]+E[I_6]$.

At the output node 74 of the charge pump of FIG. 5, the source or sink current $I_{CP}$ going to or from the capacitor 76 may be defined as follows:

$$I_{CP}=I_{CP}-I_5-I_8$$

therefore:

$$E[I_{CP}]=E[I_{CP}]-(E[I_5]+E[I_8])$$

since it has been established that $E[I_5]+E[I_8]$ is also equal to $E[I_{CP}]$, this expression reduces to:

$$E[I_{CP}]=E[I_{CP}]-E[I_{CP}]=0$$

Figure 6:
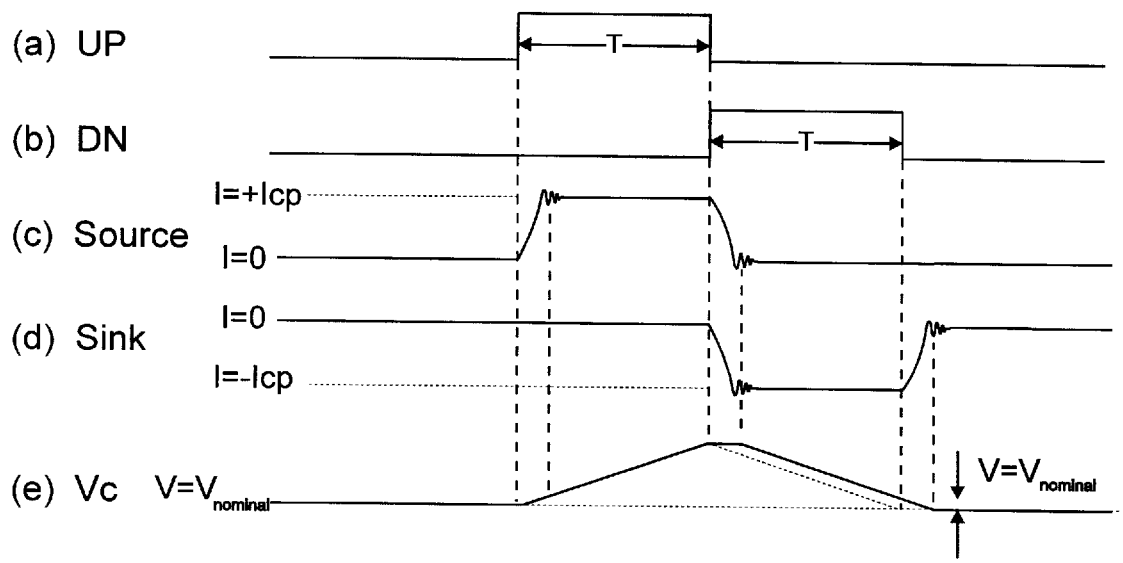
FIG. 6, a series of waveform diagrams illustrating the operational characteristics of the charge pump circuit of FIG. 5.

The symmetry of the source and sink currents of the charge pump of FIG. 5 can be appreciated with reference to the exemplary waveform diagram of FIG. 6. In FIG. 6, it can be seen that a source current (positive $I_{CP}$) exhibits an identical waveform, albeit 180° out-of-phase and of opposite polarity, and with a waveform of a sink current ($-I_{CP}$). This equality and symmetry of the source and sink currents is made possible by constructing the switch section of the charge pump exclusively from transistors of a single particular type (N-channel transistors) and constructing each of the transistors in proximity with one another and with identical geometries, so as to match their parametric performance. In addition, as will be described in greater detail below, it is also necessary to ensure the identity of the $I_{CP}$ currents from the respective current sources 62, 64 and 70. In FIG. 6, it will be noted that both the source and sink current waveforms have similar rise and fall characteristics, as well as similar "ring" characteristics as the current reaches the $I_{CP}$ maximum and similar "ring" characteristics as the current returns to zero. Accordingly, as shown in FIG. 6c, when these currents are averaged over a phase detector correction cycle, the source current deposits a specific charge on the capacitor (76 of FIG. 5) such that the control voltage $V_C$ of the filter rises, in linear fashion, from zero to a specific value, at which time the sink current removes charge from the capacitor 76, such that the control voltage $V_C$ returns, in linear fashion, to precisely its starting point, i.e., zero volts. In contrast to a prior art-type charge pump, the charge pump according to the present invention leaves no residual charge on the capacitor 76 and, therefore, does not perturb the performance of the VCO. Accordingly, lock is maintained to a significantly higher degree than was achievable by prior art-type charge pumps.

Figure 7:
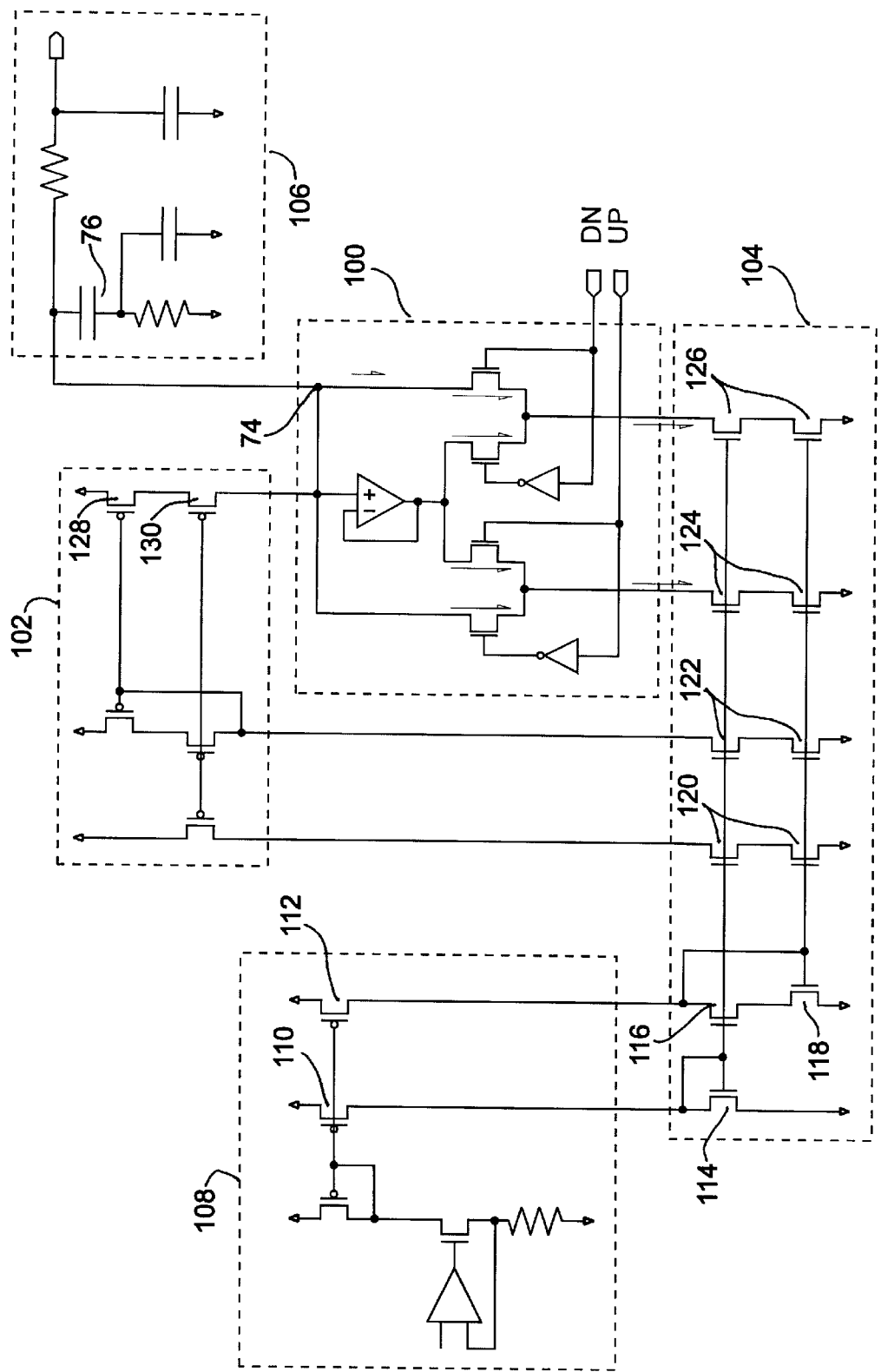
FIG. 7 is a semi-schematic circuit diagram of a high precision charge pump with error cancellation, including a precision charge pump current generating source and a loop filter, in accordance with the practice of principles of the invention.

Turning now to FIG. 7, there is depicted a semi-schematic circuit diagram of the charge pump switch section 100 in combination with an appropriate current sources, divided into an upper current source 102 and a lower current source 104 coupled to the switch section 100 so as to provide $I_{CP}$ currents to the common drain nodes and common source nodes, respectively, to the transistors of the switch section 100. Also depicted in FIG. 7 is an analog filter 106 comprising a capacitor element identified as numeral 76 to correspond with the capacitor 76 of FIG. 5. The analog filter 106 is connected to an output current node 74 of the switch section 100, in similar fashion as the capacitor 76 was coupled to the current node 74 of the embodiment of FIG. 5.

In accordance with practice of principles of the invention, the current $I_{CP}$ is defined by a precision charge pump current generating circuit 108. The precision charge pump current generating circuit 108 is constructed and operates in accordance with the circuit described in co-pending application entitled High Speed Phase Lock Loop Having Constant Band Width, filed on instant date herewith and commonly owned by the Assignee of the present invention, the entire disclosure of which is expressly incorporated herein by reference. The generating circuit 108 defines a precision charge pump current $I_{CP}$ which is directed through P-channel mirror transistors 110 and 112 to the lower current source 104. In the lower current source 104, the $I_{CP}$ currents are directed through N-channel bias transistors 114, 116 and 118 so as to develop $V_{GS}$ bias for subsequent pairs of N-channel current mirror transistors indicated at 120, 122, 124 and 126. Two of the N-channel current mirror pairs, 120 and 122, develop a bias for the P-channel transistors of the upper current source 102. The remaining cascode pairs of N-channel transistors 124 and 126 are coupled to the switch section 100 and function as the current sources 62 and 64 of FIG. 5.

It will necessarily be understood that the transistors comprising the current mirrors 120, 122, 124 and 126 are all constructed with identical geometries and in relative proximity to one another, such that the currents therethrough will be as identically equal as the capabilities of the semiconductor manufacturing technology will allow. Accordingly, it will be understood that $I_{CP}$ of the current source 62 of FIG. 5 will be equal to $I_{CP}$ of the current source 64 of FIG. 5, at least within the capabilities of the semiconductor manufacturing technology used. In like fashion, the $I_{CP}$ current through current mirrors 120 and 122 develop a bias in the P-channel transistors of the upper current source 102 which defines an $I_{CP}$ current through the P-channel current mirror transistors 128 and 130, which are, in turn, coupled to the switch section 100 as current source 70 of FIG. 5.

Following the discussion of current identity with regard to the lower current source 104, it will be understood that the $I_{CP}$ current through the upper current source 102 will be as nearly identical to the $I_{CP}$ current through the lower current source 104 as is allowed by the capabilities of the semiconductor manufacturing process used. The actual magnitude of the $I_{CP}$ currents developed by the circuit of FIG. 7 is not particularly important to the functioning of the circuit in accordance with the invention. The current magnitude may be large or small, as suits the needs of a particular integrated circuit designer, but preferably are in the range of from about 1 $\mu$A to about 200 $\mu$A in order to realize a relatively compact circuit that does not waste valuable silicon real estate. Transistor W and L sizes are equally immaterial to the spirit of the present invention, but should be appropriately sized to provide the required current magnitude, as well as provide a fast turn-on characteristic to promptly initiate charging or discharging of the filter capacitor. Preferably, the matched N-channel switch transistors of the switch section 100 are constructed as 10× transistors, i.e., minimum L and a W of 10, but other geometries and sizes may prove equally suitable, depending on the application. Generally, the transistor width W should be designed as small as possible, in order to improve the AC performance (turn-on time) of the circuit, but must not be made too small such that internal voltage drops become significant and distort the necessary symmetry of the transistor's response characteristics.

Figure 8:
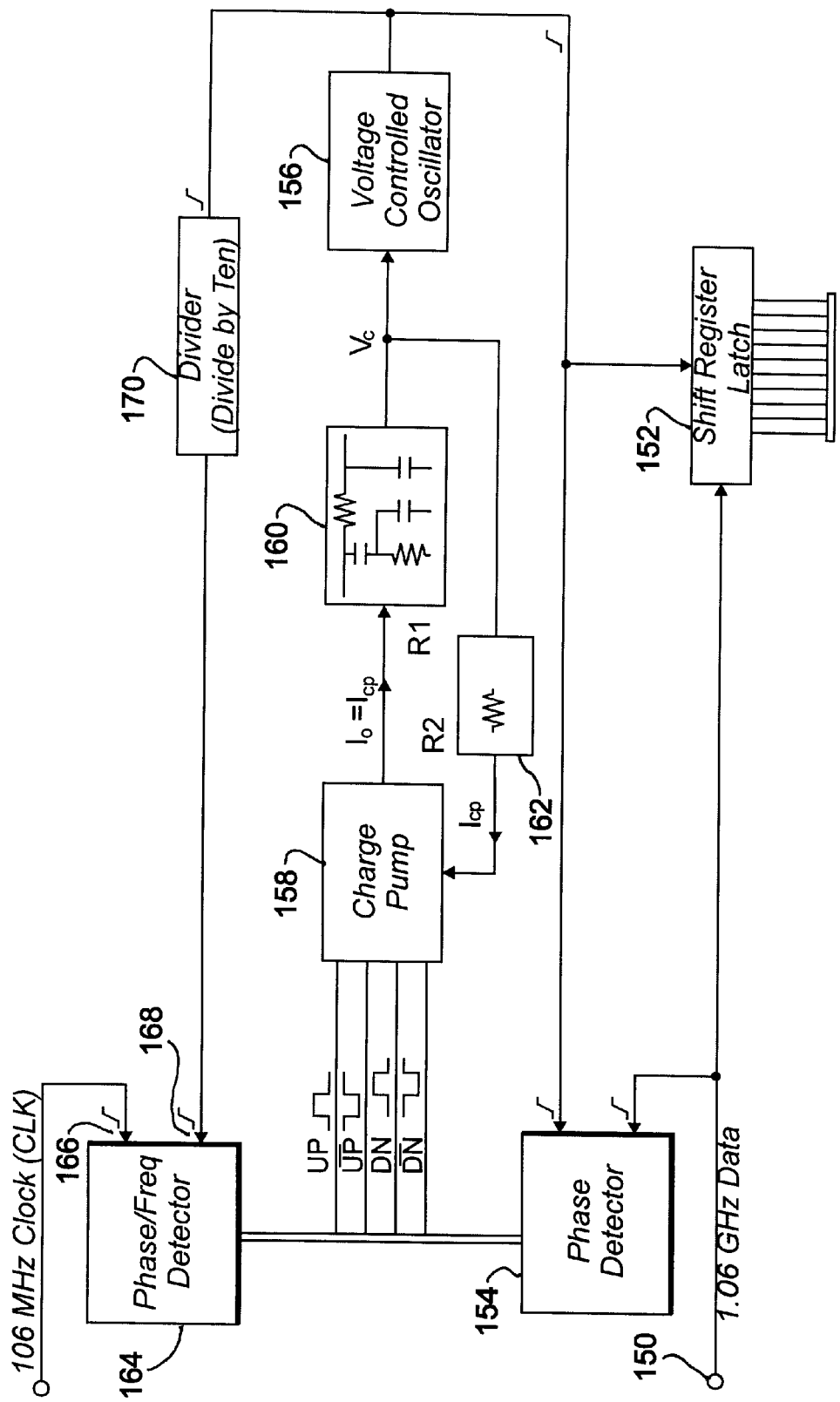
FIG. 8 is a semi-schematic simplified block diagram of a phase lock loop incorporating the high precision charge pump of FIG. 7.

Referring now to FIG. 8, there is depicted, in semi-schematic block diagram form, a generalized receiver circuit for converting an incoming serial data stream operating at 1.06 GHz into 10-bit parallel data provided on a parallel data bus operating at data rates of about 106 MHz. The receiver circuit is connected to a data input 150 which receives 1.06 GHz serial data. In the illustrated embodiment of FIG. 8, a serial-to-parallel converters 152, depicted as a simple shift register and latch for purposes of illustration, is connected to receive 1.06 GHz data from the input 150. Incoming serial data is shifted into the circuit 152 in accordance with a 1.06 GHz shift-in clock signal, identified as SICLK, and latched out onto a data bus when all of the register positions are filled. It will be understood by those having skill in the art that the number of register positions will be equal to the bit width of the data bus for which the circuit is designed to operate. The serial-to-parallel converter 152 is thus, merely exemplary, highly simplified, and is not intended to either define or limit the scope of the present invention. In addition, the absolute values of the incoming serial data stream, as well as the width of the parallel data bus it will be recognized as serving to provide only a context for understanding the construction and operation of a PLL in accordance with the invention. Accordingly, those skilled in the art of circuit design will recognize that the incoming serial data stream may occur at any frequency while the parallel data bus may be constructed with any bit-width without violating the scope of the present invention.

In accordance with the invention, an incoming serial data stream is received at a data input 150 and directed to a phase detector 154, wherein the rising edge of data bits comprising the serial data stream are compared in phase with the rising edges of a signal train provided by a voltage controlled oscillator (VCO) 156. The phase detector is preferably a type-IV phase detector, also referred to as a Charlie Hogge-type phase detector and is operative to provide constant and spaced-apart UP and DN pulses to a charge pump regardless of the logical state of a particular data bit. This particular phase detector implementation scheme ensures that rising edges of a VCO signal, when compared to a data ZERO signal, do not result in the PLL becoming unstable. In well known fashion, the type-IV, or Charlie Hogge-type, phase detector includes a logical NOR function, such that both the rising edge of a data ONE signal and the rising edge of a VCO signal need to be present in order that a phase comparison event take place. In the absence of a data ONE or a VCO signal, the type-IV or Charlie Hogge-type phase detector in effect operates the PLL in a "flywheel" configuration.

Either during phase comparisons, or during "flywheel" operation, the phase detector 154 produces pump-up and pump-down signals which are directed to a charge pump 158 constructed in accordance with the present invention and as illustrated in FIGS. 5 and 7. In FIG. 8, the pump-up and pump-down signals are denoted, along with their compliments, as four separate control lines UP, $\overline{\text{UP}}$, DN, and $\overline{\text{DN}}$ for purposes of clarity. As was illustrated in connection with FIGS. 5 and 7, only DN and UP are required as inputs to the charge pump, with $\overline{\text{DN}}$ and $\overline{\text{UP}}$ being internally generated through corresponding inverting buffers. The charge pump 158, in accordance with the invention, causes a pump current $I_{CP}$ to be directed to an analog filter 160 which, in turn, causes a control voltage $V_C$ to be generated which controls the oscillation frequency of the VCO 156, so as to maintain a stable phase relationship between the VCO signal train and the incoming serial data stream. A high precision charge pump current generating circuit 162 is connected to receive the control voltage $V_C$ as an input and is constructed and configured to provide a high precision charge pump reference current to the charge pump 158 such that the PLL bandwidth remains constant.

An additional detector, a phase and frequency detector (PFD) 164 is also provided and is connected in parallel-fashion with phase detector 154 to the charge pump 158. The phase and frequency detector 164 comprises a first input 166 which is connected to a stabile, external clock operating in the illustrated embodiment, at 106.25 MHz. The phase and frequency detector 164 includes a second input 168 configured to receive the signal train output of the VCO 156 after the VCO output has been processed by a divide-by-10 counter (termed herein a VCO divider) 170.

During an initialization procedure, the PLL is operated such that the VCO 156 is brought to frequency or velocity lock by operation of the phase/frequency detector 164. A source of stable frequency, such as a controlled-crystal oscillator operating at a frequency of about 106.25 MHz, is supplied to the first input 166 of the detector 164 in which it is compared with the frequency or phase velocity of the VCO 156. The VCO divider 170 divides the frequency of the output of the VCO 156 by specific value (10 in the embodiment of the present invention) and provides that divided value to the second input 168 of the phase/frequency detector 164. In the exemplary embodiment of FIG. 8, the VCO 156 is designed to operate at a frequency of about 1.06 GHz and thus, by dividing the VCO frequency by 10, the VCO divider 170 provides a signal train having a frequency of about 106 MHz to the second input 168 of the phase detector 164. This divided frequency is compared in phase with the frequency of the controlled-crystal oscillator, and the results of the phase comparison are provided as control signals to the charge pump 158. The charge pump 158 in combination with the filter 160 function to provide a control voltage $V_C$ to the voltage controlled oscillator 156 to thereby adjust the VCO velocity until the VCO is put into velocity lock. At this point, logic circuitry (not shown) passes control of the PLL to the phase detector 154 which then processes the incoming 1.06 GHz data stream.

A high-speed phase lock loop circuit has been described that includes a high precision charge pump circuit with error cancellation which functions to maintain the stability of VCO lock by providing source and sink pump currents which are substantially symmetrical. The symmetry of both source and sink pump currents is ensured by constructing the high precision charge pump from transistors of the same type (i.e., N-channel transistors) and implementing the transistors in a silicon integrated circuit in close proximity to one another and with identical geometries, such that their current characteristics will be as nearly identical as allowed by the semiconductor manufacturing process in use. The symmetry of the transistor's current response is ensured by imposing a symmetry requirement on the signal paths defining control signals for the switch transistors. Any components introduced into the signal path of a signal of one particular type (i.e., $\overline{UP}$) must mirrored by an identical component, comprising identical parasitics, in the signal path of the other signal of the same type (i.e. $\overline{DN}$).

While the invention has been described in terms of CMOS integrated circuit technology, it will be evident to one having skill in the art the invention may likewise be suitably implemented in other semiconductor technologies, such as bipolar, bi-CMOS, and the like. Moreover, the circuit according to the invention may be constructed from discrete components as opposed to a monolithic integrated circuit, so long as the individual components are matched as closely as possible to one another. In addition, it should be understood that although the circuit according to the invention has been described as fabricator from N-channel transistors, the circuit may be fabricated from P-channel transistors with equal facility. The choice of transistor polarity is not as important to the functioning of the present invention as long as all of the transistors are of the same polarity and all of the transistors are as closely matched as possible.

It will thus be recognized by those skilled in the art that various modifications may be made to the preferred and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

I claim:

1. In a PLL of the type including a type-IV phase detector in which pump-up and pump-down signals are provided to a charge pump on a continuous basis irrespective of the occurrence of a phase comparison, the charge pump sourcing and sinking a characteristic current in operative response to the pump-up and pump-down signals, the charge pump comprising:

a first, outer, current conduction path including first and second transistors connected together at a first common drain node and to a first current source configured to conduct a characteristic current, the first common drain node defining a charge pump output, the first and second transistors each having a source node and connected to respective second and third current sources each configured to conduct said characteristic current;

a second, inner, current conduction path including third and fourth transistors connected together at a second common drain node and each having a source node connected to a respective one of said second and third current sources; and voltage follower means coupled between the first and second common drain nodes of the inner and outer conduction paths for maintaining the drain potential of the inner path at substantially the same value as the drain potential of the outer path.

2. The charge pump according to claim 1, wherein the first and third transistors comprise a matched pair, each transistor characterized by an equal length and width dimension.

3. The charge pump according to claim 2, wherein the second and fourth transistors comprise a matched pair, each transistor characterized by a length and width dimension equal to the another and to the first and third transistors.

4. The charge pump according to claim 3, wherein the turn-on and turn-off characteristics of each matched pair are symmetrical such that the characteristic current sourced by the putput node defines a waveform shape symmetrical to the waveform shape defined by the characteristic current sunk by the output node.

5. The charge pump according to claim 4, wherein the transistors are N-channel transistors, each characterized by an identical length and width dimension.

6. The charge pump according to claim 5, wherein the second and fourth transistors each include a gate terminal, the gate terminal of the second transistor coupled to receive a pump-up signal of a first polarity, the gate terminal of the fourth transistor coupled to receive a pump-up signal of a complimentary polarity, and wherein the first and third transistors each include a gate terminal, the gate terminal of the third transistor coupled to receive a pump-down signal of a first polarity, the gate terminal of the first transistor coupled to receive a pump-down signal of a complimentary polarity.

7. The charge pump according to claim 6, further comprising first and second symmetrical signal paths connected respectively to the gate terminals of the second and third transistors, the first and second signal paths for carrying respectively the pump-up and pump-down signals of first polarity.

8. The charge pump according to claim 7, further comprising third and fourth symmetrical signal paths connected respectively to the gate terminals of the first and fourth transistors, the third and fourth signal paths for carrying respectively the pump-up and pump-down signals with complimentary polarity.

9. The charge pump according to claim 8, wherein the pump-up and pump-down signals of complimentary polarity are derived by respectively coupling the pump-up and pump-down signals of first polarity through a corresponding inverting buffer.

* * * * *